United States Patent
Wu et al.

(10) Patent No.: US 8,352,062 B2
(45) Date of Patent: Jan. 8, 2013

(54) ADVANCED PROCESS CONTROL FOR GATE PROFILE CONTROL

(75) Inventors: Chih-Jen Wu, Hsin-Chu (TW);
Chen-Ming Huang, Hsinchu (TW);
An-Chun Tu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 973 days.

(21) Appl. No.: 12/402,124

(22) Filed: Mar. 11, 2009

(65) Prior Publication Data
US 2010/0234975 A1 Sep. 16, 2010

(51) Int. Cl.
*G06F 19/00* (2006.01)
(52) U.S. Cl. .................. 700/121; 700/28; 700/108
(58) Field of Classification Search .............. 700/28, 700/29, 33, 44, 45, 79, 103, 105, 108–110, 700/121; 438/488, 922
See application file for complete search history.

(56) References Cited

U.S. PATENT DOCUMENTS

| | | | |
|---|---|---|---|
| 6,218,198 B1* | 4/2001 | Imao et al. | 438/7 |
| 6,511,898 B1* | 1/2003 | Sonderman et al. | 438/488 |
| 6,865,438 B1 | 3/2005 | Lin et al. | |
| 7,141,440 B2* | 11/2006 | Borden et al. | 438/5 |
| 2002/0083401 A1* | 6/2002 | Breiner et al. | 716/4 |
| 2003/0064571 A1* | 4/2003 | Takeda et al. | 438/488 |
| 2008/0124826 A1 | 5/2008 | Lin et al. | |
| 2008/0233662 A1 | 9/2008 | Shen et al. | |

* cited by examiner

*Primary Examiner* — Mohammad Ali
*Assistant Examiner* — Nathan Laughlin
(74) *Attorney, Agent, or Firm* — Haynes and Boone, LLP

(57) ABSTRACT

A method for fabricating a integrated circuit with improved performance is disclosed. The method comprises providing a substrate; performing a plurality of processes to form a gate stack over the substrate, wherein the gate stack comprises a gate layer; measuring a grain size of the gate layer after at least one of the plurality of processes; determining whether the measured grain size is within a target range; and modifying a recipe of at least one of the plurality of processes if the measured grain size of the gate layer is not within the target range.

20 Claims, 6 Drawing Sheets

ADVANCED PROCESS CONTROL FOR GATE PROFILE CONTROL

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. It has been observed that such scaling down introduces challenges in maintaining process variations at acceptable levels. For example, as process geometries continue to decrease from 65 to 45 nanometer and beyond, a profile of a gate stack becomes critical to IC device performance. Process variations fabricate IC devices having varying gate profiles, which may stray from a target gate profile. Conventional IC device manufacturing lacks a way to manage and/or control the formation of gate stacks, wherein completed gate stacks exhibit the desired target gate profile.

Accordingly, what is needed is a method for fabricating an IC device that addresses the above stated issues.

SUMMARY

A method for fabricating an integrated circuit device is provided. In one embodiment, an advanced process control (APC) method for fabricating an integrated circuit device comprises providing a substrate; performing a plurality of processes to form a gate stack over the substrate, wherein the gate stack comprises a gate layer; measuring a grain size of the gate layer after at least one of the plurality of processes; determining whether the measured grain size of the gate layer is within a target range; and modifying a processing recipe of at least one of the plurality of processes if the measured grain size of the gate layer is not within the target range.

In one embodiment, a method for controlling a gate profile during integrated circuit device fabrication comprises performing a deposition process to form a gate layer over a wafer; performing a first grain size measurement after the deposition process; performing an annealing process to the gate layer based on the first grain size measurement; performing a second grain size measurement after the annealing process; and performing an etching process on the gate layer based on the second grain size measurement.

In one embodiment, a system for manufacturing integrated circuit devices comprises a processing tool for performing a plurality of processes to form one or more gate stacks having a gate profile; and a controller in communication with the processing tool, wherein the controller manages and controls the gate profile of the one or more gate stacks by monitoring a measured grain size of a layer of the one or more gate stacks, the measured grain size obtained after at least one of the plurality of processes; determining whether the measured grain size is within a target range; and modifying a recipe of at least one of the plurality of processes if the measured grain size of the layer is not within the target range. The plurality of processes include a deposition process, an annealing process, and an etching process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 2A:
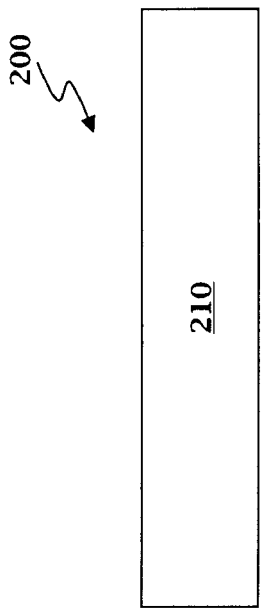
FIGS. 2A-2C are various cross-sectional views of embodiments of an integrated circuit device during various fabrication stages according to the method of FIG. 1.

The present disclosure relates generally to methods for manufacturing integrated circuit devices, and more particularly, to a process control method for manufacturing integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2B:
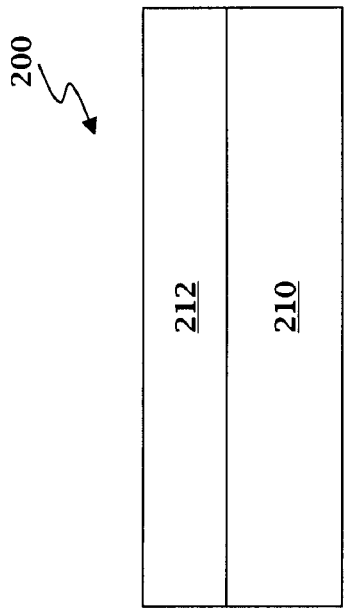
Figure 2C:
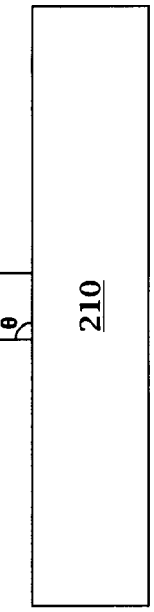
Figure 1:
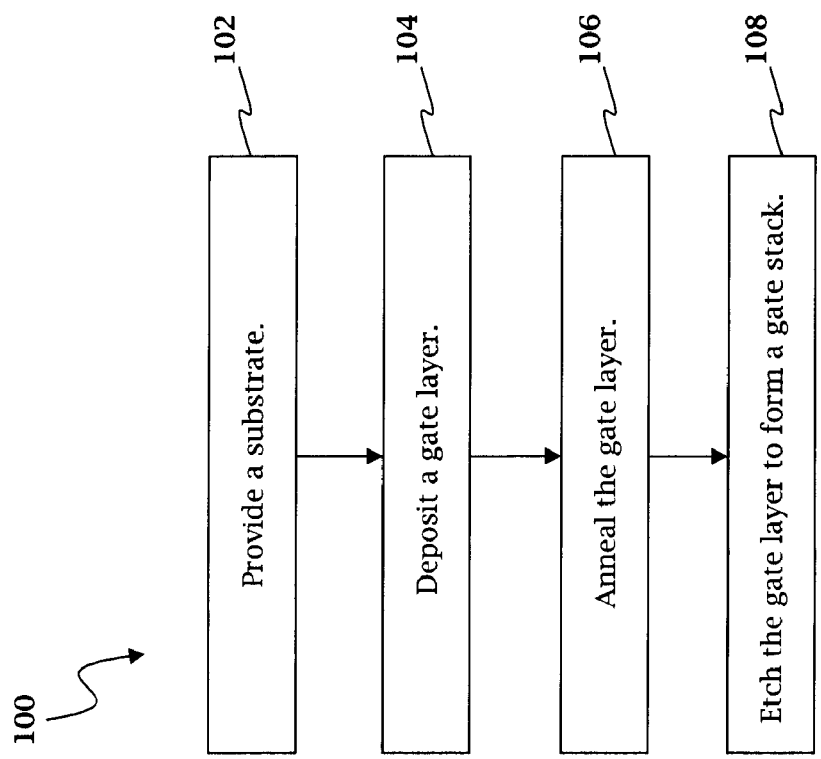
FIG. 1 is a flow chart of a method for fabricating an integrated circuit device according to aspects of the present disclosure.

With reference to FIGS. 1 through 2C, a method 100 and a semiconductor device 200 are collectively described below. FIG. 1 is a flow chart of one embodiment of the method 100 for fabricating the semiconductor device 200. FIGS. 2A-2C are various cross-sectional views of the semiconductor device 200 according to one embodiment, in portion or entirety, during various fabrication stages of the method 100. The semiconductor device 200 may be an integrated circuit, or portion thereof, that may comprise static random access memory (SRAM), memory cells, and/or logic circuits; passive components such as resistors, capacitors, inductors, and/or fuses; active components, such as P-channel field effect transistors (PFETs), N-channel field effect transistors (NFETs), metal-oxide-semiconductor field effect transistors (MOSFETs), complementary metal-oxide-semiconductor transistors (CMOSs), bipolar transistors, high voltage transistors, and/or high frequency transistors; other suitable components; and/or combinations thereof. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIGS. 1 and 2A, the method 100 begins at step 102 wherein a substrate 210 is provided. In the present embodiment, the substrate 210 is a semiconductor substrate comprising silicon. The substrate 210 may comprise an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate may be a semiconductor on insulator (SOI) or a thin film transistor (TFT). In some examples, the substrate may include a doped epi layer or a buried layer. In other examples, the compound semiconductor substrate may have a multilayer structure, or the silicon substrate may include a multilayer compound semiconductor structure. Still, in other examples, the substrate 210 may comprise a non-semiconductor material, such as glass.

Substrate 210 may include various doping configurations depending on design requirements as known in the art, such as p-type substrate regions or n-type substrate regions. In some embodiments, the substrate 210 may include doped regions. The doped regions may be doped with p-type dopants (e.g., boron or $BF_2$) and/or n-type dopants (e.g., phosphorus or arsenic). The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (an NMOS device) and regions configured for a P-type metal-oxide-semiconductor transistor device (a PMOS device).

The substrate 210 may further include one or more isolation regions, which may isolate various regions of the substrate (e.g., NMOS and PMOS device regions) of the substrate 210. The isolation region may utilize isolation technology, such as LOCOS or STI, to define and electrically isolate the various regions. The isolation region may comprise silicon oxide, silicon nitride, silicon oxynitride, fluoride-doped silicate glass, a low-K dielectric material, other suitable materials, and/or combinations thereof. The isolation region may be formed by any suitable process.

Referring to FIG. 2B, at step 104, one or more gate layers are formed over the substrate 210. In the present embodiment, a gate layer 212 is formed over the substrate 210 by any suitable process. For example, the gate layer 212 may be formed by conventional deposition processes, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), epitaxial growth methods (e.g., selective epitaxy growth), sputtering, plating, spin-on coating, other suitable methods, and/or combinations thereof.

The gate layer 212 may comprise one or more high-k dielectric layers, dummy gate layers, hard mask layers, interfacial layers, capping layers, diffusion/barrier layers, dielectric layers, conductive layers, other suitable layers, and/or combinations thereof. For example, the gate layer 212 may comprise a layer comprising a high-k dielectric material, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The gate layer 212 may comprise a layer including a dielectric material, such as silicon-containing materials including polycrystalline silicon, silicon oxide, silicon nitride, silicon oxynitride, and silicon carbide; germanium-containing materials; hafnium oxide, zirconium oxide, titanium oxide, aluminum oxide, hafnium dioxide-alumina ($HfO_2$—$Al_2O_3$) alloy, other suitable dielectric materials, and/or combinations thereof. In some embodiments, the gate layer 212 may comprise a layer of silicon dioxide and a layer of high-k dielectric material. Further, the gate layer 212 may be doped polycrystalline silicon with the same or different doping. The gate layer 212 may comprise a conductive layer comprising aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof. The gate layer may comprise a work function layer. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the work function layer may include doped-conducting metal oxide materials. It is understood that the semiconductor device 200 may further include antireflective coating layers (e.g., a top antireflective coating layer and/or a bottom antireflective coating layer).

At step 106, an annealing process is performed on the gate layer 212. The annealing process comprises any suitable process. In some embodiments, the annealing process comprises one or more rapid thermal annealing (RTA) processes and/or laser annealing processes. The annealing process can be tuned by varying parameters, such as annealing power, annealing temperature, annealing time, pressure in the process chamber, environment for the process chamber (e.g., varying ambient environments, vacuum environment, etc.).

Referring to FIGS. 1 and 2C, at step 108, a gate stack 220 comprising the gate layer 212 is formed. The gate stack 220 may be formed by any suitable process, such as conventional photolithography patterning processes, etching processes, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. In one example, a gate layer is deposited over the substrate 210. Then, a layer of photoresist is formed over the gate layer by a suitable process, such as spin-on coating, and patterned to form a patterned photoresist feature by a proper lithography patterning method. The pattern of the photoresist can then be transferred by a dry etching process to the underlying layers (i.e., the gate layer) to form the gate stack 220 as shown in FIG. 2A. The photoresist layer may be stripped thereafter.

It is understood that a plurality of gate stacks may be formed over the substrate 210. It is further understood that the semiconductor device 200 may undergo further CMOS or MOS technology processing to form various features known in the art. For example, gate sidewall spacers may be formed on each side of the gate stacks 220. In some embodiments, lightly doped regions (referred to as LDD regions) may be formed in the substrate 210 using any suitable process. In another example, source and drain regions (referred to as S/D regions) may be formed in the substrate 210. In still another example, various contacts/vias and multilayer interconnect features (e.g., metal layers and interlayer dielectrics) may be formed on the substrate 210 and configured to connect the various features or structures of the semiconductor device 200.

As technology nodes continue to decrease, particularly to 40-nm node technology and below, the profile of the gate stack 220 becomes critical. Referring to FIG. 2C, the gate stack 220 comprises a profile with a side wall angle $\theta$. A grain size of a gate layer (e.g., gate layer 212) can impact the resulting gate stack profile. Grain size is a function of the deposition and/or annealing process conditions. Thus, if one can determine the grain size of the layer (or layers) utilized to form the gate stack, process recipes for subsequent processes of the same wafer and process recipes for processing of subsequent wafers may be modified to achieve a gate stack with a target profile (or side wall angle). For example, a larger measured grain size of the gate layer may require a faster etching rate and/or a higher temperature anneal to ensure that the gate stack comprises the target profile. Currently, conventional processing lacks a process and/or automated (or advanced) process control (APC) system to monitor conditions that affect the gate profile. Accordingly, the present embodiments provide an APC system to monitor the composition of the layers utilized to form the gate stack, wherein processing recipes may be modified to change (or alter) the composition of the layers in order to achieve the target profile.

Figure 3:
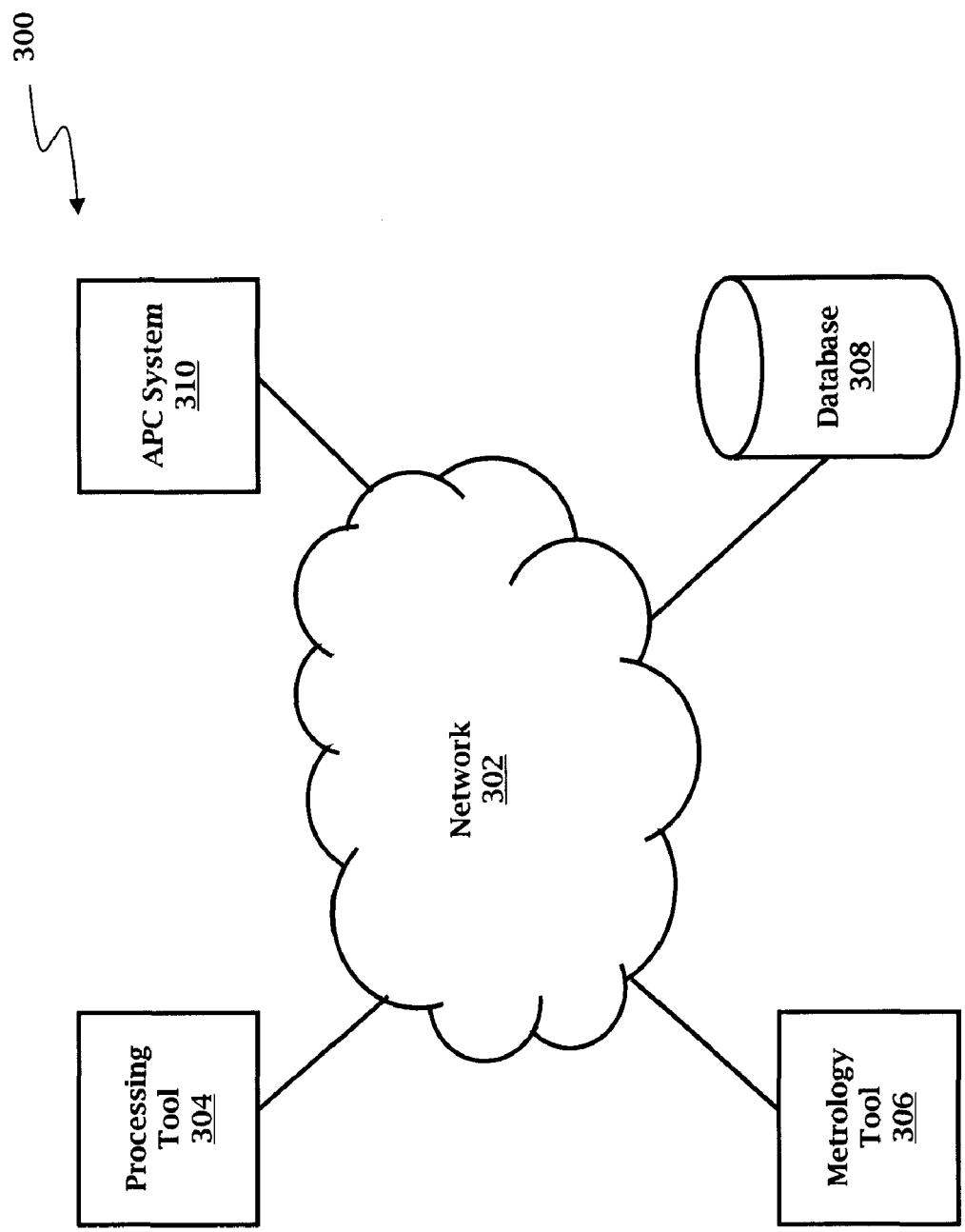
FIG. 3 is a block diagram illustrating an integrated circuit device fabrication system in which various embodiments disclosed herein are implemented.

Referring to FIG. 3, an integrated circuit manufacturing system 300 is illustrated. The system 300 comprises a plurality of entities that are connected by a communications network 302. The system 300 may implement a semiconductor manufacturing process that fabricates a plurality of substrates (or wafers). A substrate includes a wafer, a semiconductor substrate, a mask (photomask or reticle, collectively referred to as mask), or any base material on which processing is conducted to produce layers of material, pattern features, and/or integrated circuits. In the present embodiment, a gate stack formation process is performed by the system 300, such as the process described in FIGS. 1 and 2A-2C. The network 302 may be a single network or may be a variety of different networks, such as an intranet and the Internet, and may include both wired and wireless communication channels. Each entity may interact with other entities and may provide services to and/or receive services from the other entities.

The entities include one or more processing tools 304, metrology tools 306, databases 308, and Advanced Process Control (APC) systems 310. It is understood that the system 300 may further comprise various processing tools (e.g., deposition tools, annealing tools, etching tools, electroplating tools, furnaces, etc.), metrology equipment, and controllers that perform other stages of integrated circuit device fabrication but are not illustrated for the sake of simplicity and clarity. In the present embodiment, the processing tool 304 may comprise a deposition tool, an annealing tool, and an etching tool. The deposition tool, annealing tool, and etching tool are devices of a type known in the art. A semiconductor wafer may be placed into the deposition tool and subjected to a deposition process, into the annealing tool and subjected to an annealing process, and/or into the etching tool and subjected to an etching process. The deposition, annealing, and etching processes may comprise any of the processes known in the art and/or described herein. In some embodiments, in a single processing tool 304, a deposition process, annealing process, and etching process may be performed to form various features that form an integrated circuit. For example, the processing tool 304 may in situ form a gate stack over a substrate by performing a deposition, annealing, and etching process. In some embodiments, the system 300 comprises a separate processing tool 304 for each process, such as a deposition processing tool, an annealing processing tool, and an etching processing tool. The process tool 304 may further include a plurality of sensors for monitoring pressure, gas flows, time, temperature, impurity levels, and/or other parameters.

The metrology tool 306 comprises any type of metrology tool known by those skilled in the art. The metrology tool 306 measures various characteristics (and/or details) of the integrated circuit device as it is being fabricated. The measurement data may include wafer results such as wafer parameters measured by the metrology tool 306, such as sheet resistance, reflectivity, stress, particle density, and critical dimension. In the present embodiment, the metrology tool 306 measures a grain size of a material layer (for example, a gate layer) after a deposition, annealing, and/or etching process. The metrology tool 306 may also measure a thickness of the material layer after the deposition, annealing, and/or etching process. The metrology tool 306 may classify defects and features of the product being manufactured. The metrology tool 306 may include electrical, optical, and/or analytical tools, such as microscopes (e.g., scanning electron microscopes and/or optical microscopes), micro-analytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, C-V measurement tools, focused ion beam (FIB), laser surface defect scanners, residual gas analyzers, process tool particle counters, and/or a variety of other metrology tools. In some embodiments, the metrology tool comprises an after development inspection (ADI) metrology tool and/or an after etching inspection (AEI) metrology tool, such as ADI and AEI devices known in the art. In some embodiments, the metrology tool 306 includes wafer assessment testing tools.

The metrology tool 306 can send the measurement data to the database 308 for storing. In some embodiments, the measurement data is directly provided to the APC system 310. In some embodiments, the database includes a tool database, a configuration database, and/or a cross-tool analysis database. The configuration database may store configuration information, process control models, and process control strategies for the process tool 304. For example, the configuration information may be used to adjust a process parameter such as gas flow, chamber pressure, and/or process time. Optimizations and other adjustments may be made to the process tool 304 via the network 302. The cross-tool analysis database may include information obtained from multiple process tools 304. Such information may be used to analyze the performance, yield rate, and other data of each process tool with that of the other process tools. It is understood that aspects of the present disclosure may be implemented within the APC system 310 to analyze information either from the metrology tools 306 or the database 308 or other proper equipment in the system 300.

The APC system 310 controls various processes within the system 300. The APC system 310 may comprise a computer that can be a conventional, commercially-available computer, or any other suitable computer hardware. The hardware of the APC system 310 includes a processor and a memory. The memory stores a computer program that is executed by the processor, and that causes the computer to control the various process tools 304. The computer is operable to perform actions including manipulating information (including manipulating information using a model), receiving information, storing information, and transferring information. In an embodiment, the computer may include multiple computers. In an embodiment, the computer may include equipment or code embedded in a process tool, such as, for example, the process tool 304. The computer may further include one or multiple user interfaces.

Figure 4:
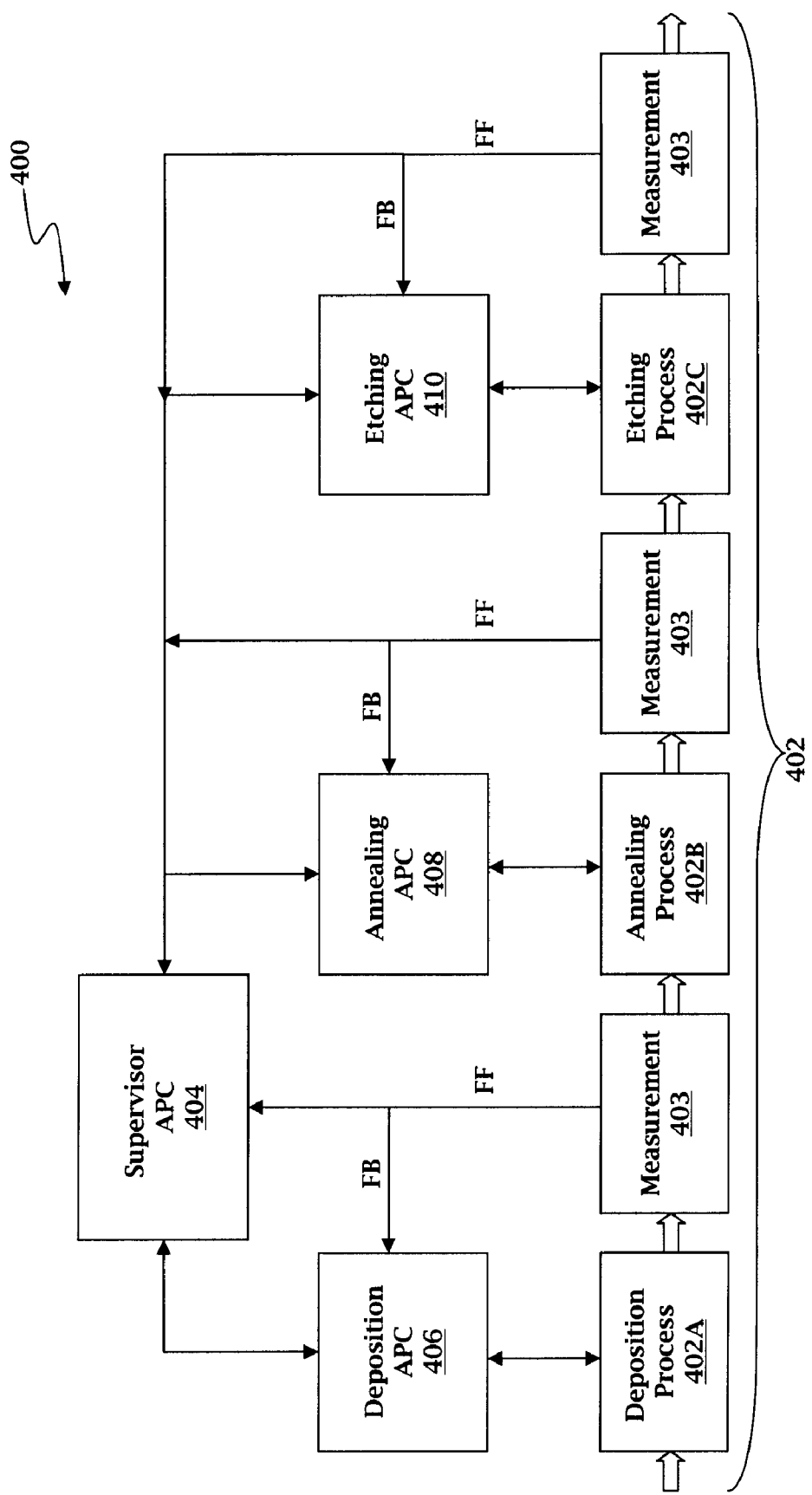
FIG. 4 is a block diagram of an advanced process control (APC) system for controlling and/or monitoring a material process flow according to aspects of the present disclosure.

In the present embodiment, the APC system 310 may be similar to an APC system 400 illustrated in FIG. 4. The APC system 400 can manage, perform, and/or control a material process flow 402. The material process flow 402 includes any process steps for fabricating an integrated circuit device. The material process flow 402 illustrates three processes: a deposition process 402A, an annealing process 402B, and an etching process 402C. The deposition, annealing, and etching processes 402A, 402B, 402C may fabricate one or more gate stacks on a wafer, such as the processes described with reference to FIGS. 1 and 2A-2C. For example, the deposition process 402A involves forming the gate layer 212 over the substrate 210; the annealing process 402B involves annealing the gate layer 212; and the etching process 402C involves etching the gate layer 212 to form the gate stack 220. The deposition, annealing, and etching processes 402A, 402B, 402C may be performed in various processing tools 304 or in a single processing tool 304. In an embodiment, the material process flow 402 may be utilized for a single damascene process, a dual damascene process, or a variety of other fabrication methods, as known in the art. It is understood that multiple wafers are likely to be processed grouped in lots. As such, the reference to a wafer or substrate in the singular in the present disclosure does not necessarily limit the disclosure to a single wafer, but may be illustrative of a lot including a plurality of wafers, a plurality of lots, or any such grouping of material. It is further understood that additional processes, as known in the art, may be included before, after, and/or among the illustrated processes.

At various points within the material process flow 402, a measurement process 403 can be performed on the fabricated wafers. The measurement process 403 may be controlled or performed by the process tool 304, metrology tool 306, the APC system 310 itself, and/or a combination thereof. FIG. 4 illustrates a measurement process 403 after each process 402A, 402B, 402C. It is understood that a measurement process 403 is not required after each process. The measurement process 403 obtains any suitable measurements, for example, parameters, such as thickness, grain size, critical dimension, other suitable parameters, and/or combinations thereof. As noted above, the grain size of the gate stack ultimately affects the resulting gate profile. Accordingly, in the present embodiment, the measurement process 403 obtains grain size measurements (or grain size indexes) of the gate layer, such as gate layer 212, throughout the material process flow 402. Measuring the grain size may be accomplished by any suitable method. For example, optical scattering methods may be utilized to obtain grain size measurements. In some embodiments, measuring the grain size or obtaining grain size index comprises utilizing R.I. values and/or haze monitoring.

The material process control 402 may be performed, controlled, and/or managed by the APC system 400. The APC system 400 comprises one or more Supervisor APC controllers and process APC controllers. For example, APC system 400 comprises a Supervisor APC controller 404 and three process APC controllers: a deposition process APC controller 406, an annealing process APC controller 408, and an etching process APC controller 410. In some embodiments, a single process APC controller may perform the functions of the deposition, annealing, and etching process controllers 406, 408, 410. In some embodiments, a single APC controller may perform the functions of the Supervisor APC controller 404 and the process APC controllers 406, 408, 410. The Supervisor APC controller 404 can communicate with process tools 304, metrology tools 306, databases 308, measurement processes 403, process APC controllers 406, 408, 410, and/or any other suitable system, tool, or controller. In some embodiments, the Supervisor APC controller communicates directly with the processes 402A, 402B, 402C. The process APC controllers 406, 408, 410 communicate with the various process tools 304 (and/or process chambers), metrology tools 306, databases 308, processes 402A, 402B, 402C, measurement processes 403, Supervisor APC controller 404, and/or any other suitable system, tool, or controller.

The APC controllers 404, 406, 408, 410 can comprise software to implement controlling and have an ability to handle multiple tasks simultaneously and dynamically. The APC controllers 404, 406, 408, 410 can include hardware, including a computer, a network, and/or an interface to bridge communication between one another, the entities of system 300, a manufacturing execution system (MES), a computer integrated manufacturing system (CIM), an automatic material handling system (AMHS), a virtual fab, other suitable systems, and/or combinations thereof. As further discussed below, the APC system 400, particularly the APC controllers 404, 406, 408, 410 facilitate control of a resulting gate profile while a wafer is being fabricated. The system 400 can ensure that a resulting gate profile exhibits a target profile during the manufacture of a single wafer and/or that multiple wafers (for example, multiple wafers within a lot) exhibit a uniform gate profile.

The exchange of information in the APC system 400 concerning the material process flow 402 facilitates such gate profile control This information exchange includes the exchange of feedback data and feed-forward data. Feedback data includes data transferred on paths denoted by FB, and feed-forward data includes data transferred on paths denoted by FF. A communication may include both feedback and feed-forward data. The feed-forward data may be used to set wafer specific process parameters and/or process targets for subsequent processing of a wafer. For example, feed-forward data includes measurement data associated with a first wafer being processed that is used to determine subsequent process parameters and/or targets for the first wafer. The feedback data may be used to determine process parameters and/or process targets for the processing of subsequent wafers. For example, feedback data includes measurement data associated with the first wafer that is used to determine process parameters and/or targets for a second wafer.

The deposition process APC controller 406 determines various deposition process parameters for the deposition process 402A, such as deposition time, temperature, gas flow rate, any other suitable parameter, and/or combinations thereof. The deposition process parameters determined for each wafer define a deposition processing recipe, which may be chosen to provide a deposited layer having a target grain size. In some embodiments, the Supervisor APC 404 may determine various deposition parameters and/or deposition results. In some embodiments, the Supervisor APC 404 provides a desired deposition result to the deposition process APC controller 406, which then determines a deposition processing recipe to obtain such result. The deposition process APC controller 406 sends the determined deposition process parameters to the deposition process 402A.

The annealing process APC controller 408 determines various annealing process parameters for the annealing process 402B, such as annealing power, annealing time, annealing temperature, cooling rate, any other suitable parameter, and/or combinations thereof. The annealing process parameters determined for each wafer may define an annealing processing recipe, which may be chosen to ensure that the annealed gate layer exhibits the target grain size. In some embodiments, the Supervisor APC 404 may determine various annealing parameters and/or annealing results. In some embodiments, the Supervisor APC 404 provides a desired annealing result to the annealing process APC controller 408, which then determines an annealing processing recipe to obtain such result. The annealing process APC controller 408 sends the determined annealing process parameters to the annealing process 402B.

The etching process APC controller 410 determines various etching process parameters for the etching process 402C, such as etching time, gas flow rate, etching selectivity, pressure, any other suitable parameter, and/or combinations thereof. The etching process parameters determined for each wafer may define an etching process recipe, which may be chosen to ensure that the etched layer exhibits the target grain size. In some embodiments, the etching process recipe may be chosen to ensure that the etched layer forms gate stacks having a target gate profile. In some embodiments, the Supervisor APC 404 may determine various etching parameters and/or etching results. In some embodiments, the Supervisor APC 404 provides a desired etching result to the etching process APC controller 410, which then determines an etching processing recipe to obtain such result. The etching process APC controller 410 sends the determined etching process parameters to the etching process 402C.

The target grain size may be a range of grain sizes that is considered a normal range. For example, if a deposited layer having a grain size within the normal range is annealed and etched to form a gate stack, the resulting gate stack exhibits the target gate profile. In some embodiments, the target grain size is a pre-determined grain size. In some embodiments, the target grain size is a grain size that is chosen based on measurement data received. The target gate profile includes target feature dimensions, such as gate height, gate width, side wall angle, and/or gate critical dimension. The target gate profile and/or target grain size (collectively referred to as target parameters) may be determined by any suitable method. For example, the target parameters may be input by a user. In the present embodiment, the target parameters (i.e., target gate profile and target grain size) are delivered to the deposition, annealing, and/or etching process APC controllers 406, 408, 410 by the Supervisor APC controller 404. The deposition, annealing, and/or etching process parameters are then determined by the deposition, annealing, and etching process APC controllers 406, 408, 410, respectively. The determined parameters define the deposition, annealing, and/or etching process recipes needed to substantially yield the target parameters, specifically, the target gate profile and/or target grain size.

The deposition, annealing, and/or etching process parameters may be determined by the deposition, annealing, and etching process APC controllers 406, 408, 410, respectively, by a model-based controller. In some embodiments, the deposition, annealing, and etching process APC controllers 406, 408, 410 utilize a model-based, run-to-run controller. In some embodiments, the controller includes a part-effect model that may take into account various design rules for the wafer. The design rules may include circuit pattern density and specific requirements for performance of a product being fabricated. The design rules may be stored by a database associated with the APC system 400. In one example, the design rules are stored by the database 308, which may be communicated to the various processing tools 304, metrology tools 306, and/or APC systems 310 (e.g., APC system 400). In some embodiments, the controller includes a tool-effect model that may take into account process deviations particular to the tool. In a further embodiment, the tool-effect model may include a chamber specific model for a multiple chamber tool.

The deposition, annealing, and etching process APC controllers 406, 408, 410 can periodically update the models used to determine the deposition, annealing, and/or etching process parameters, respectively, utilizing feed-forward and/or feedback data received from the material process flow 402. For example, referring to FIG. 4, the deposition, annealing, and etching process APC controllers 406, 408, 410 may receive feed-forward data. The feed-forward data can include measurement data from the post-deposition, post-annealing, and/or post-etching measurement processes 403 that is transmitted to Supervisor APC controller 404. The feed-forward data from the post-deposition, post-annealing, and post-etching measurements 403 includes a grain size measurement (for example, a grain size measurement of the deposited gate layer, annealed gate layer, and/or etched gate layer). The feed-forward data from the post-etching measurement may include measurements of an etched feature. For example, if the etched feature is a gate stack, measurement data fed forward may include critical dimension and/or side wall angle measurements of the gate stack. The Supervisor APC controller 404 utilizes the fed-forward measurement data to determine a wafer specific process target for subsequent processes. For example, the Supervisor APC controller 404 may utilize the grain size measurement from the post-deposition measurement to determine the target grain size in the annealing process 402B, or the grain size measurement from the post-annealing measurement to determine the target grain size in the etching process 402C, etc. The target grain size determined by the Supervisor APC controller 404 may then be forwarded to the annealing and etching process APC controllers 408, 410 so that the annealing and etching process APC controllers 408, 410 can modify the annealing and/or etching process recipes to obtain the desired targets. In some embodiments, the Supervisor APC controller 404 may utilize the grain size measurement and/or gate profile measurements from the post-annealing and post-etching measurements to determine target parameters for the deposition process 402A of subsequent wafers. In some embodiments, the Supervisor APC controller 404 determines the process target using a model derived from experimental data. In some embodiments, the Supervisor APC controller 404 functions to control at least one specific process parameter affected by multiple process steps, such as, for example grain size and/or gate profile.

Further referring to FIG. 4, the deposition, annealing, and etching process APC controllers 406, 408, 410 may receive feedback data including process data received from the deposition, annealing, and etching processes, respectively, and/or measurement data acquired during post-deposition, post-annealing, and/or post-etching measurements 403. The process data can include data associated with the deposition, annealing, and/or etching processing tool, such as the deposition, annealing, etching process parameters and processing tool parameters utilized, including a designation of a tool section in which the processing occurred (e.g., a designation of the chamber performing the process). The feedback data from the post-deposition, post-annealing, and post-etching measurements 403 include a grain size measurement (for example, a grain size measurement of the deposited gate layer, annealed gate layer, and/or etched gate layer). The feedback data from the post-deposition measurement may include a thickness measurement and/or thickness uniformity measurements. The feedback data from the post-etching measurement may include measurements of an etched feature. For example, if the etched feature is a gate stack, measurement data fed back may include critical dimension and/or side wall angle of the gate stack.

Upon receiving the feedback data, the deposition, annealing, and etching process APC controllers 406, 408, 410 may determine whether the deposition, annealing, and/or etching processing recipe should be modified for subsequent wafers. In some embodiments, the APC controllers 406, 408, 410 determine a difference between the feedback data, which illustrates an actual process output, and a model-predicted process output. The deposition, annealing, and etching process APC controllers 406, 408, 410 may utilize this difference to update the model for use in determining a deposition, annealing, and/or etch process parameter for a subsequent wafer. In an embodiment, an exponentially weighed moving average (EWMA) is used to filter outlier data. The difference in the predicted and actual output may be a result of process drift due to, for example, the aging of the processing chamber, preventive maintenance performed on a tool, and/or a variety of other factors as known in the art. The frequency of the model update may be on a wafer-by-wafer basis, lot-by-lot basis, process run-to-run basis, and/or any other frequency determined by the user.

Figure 5:
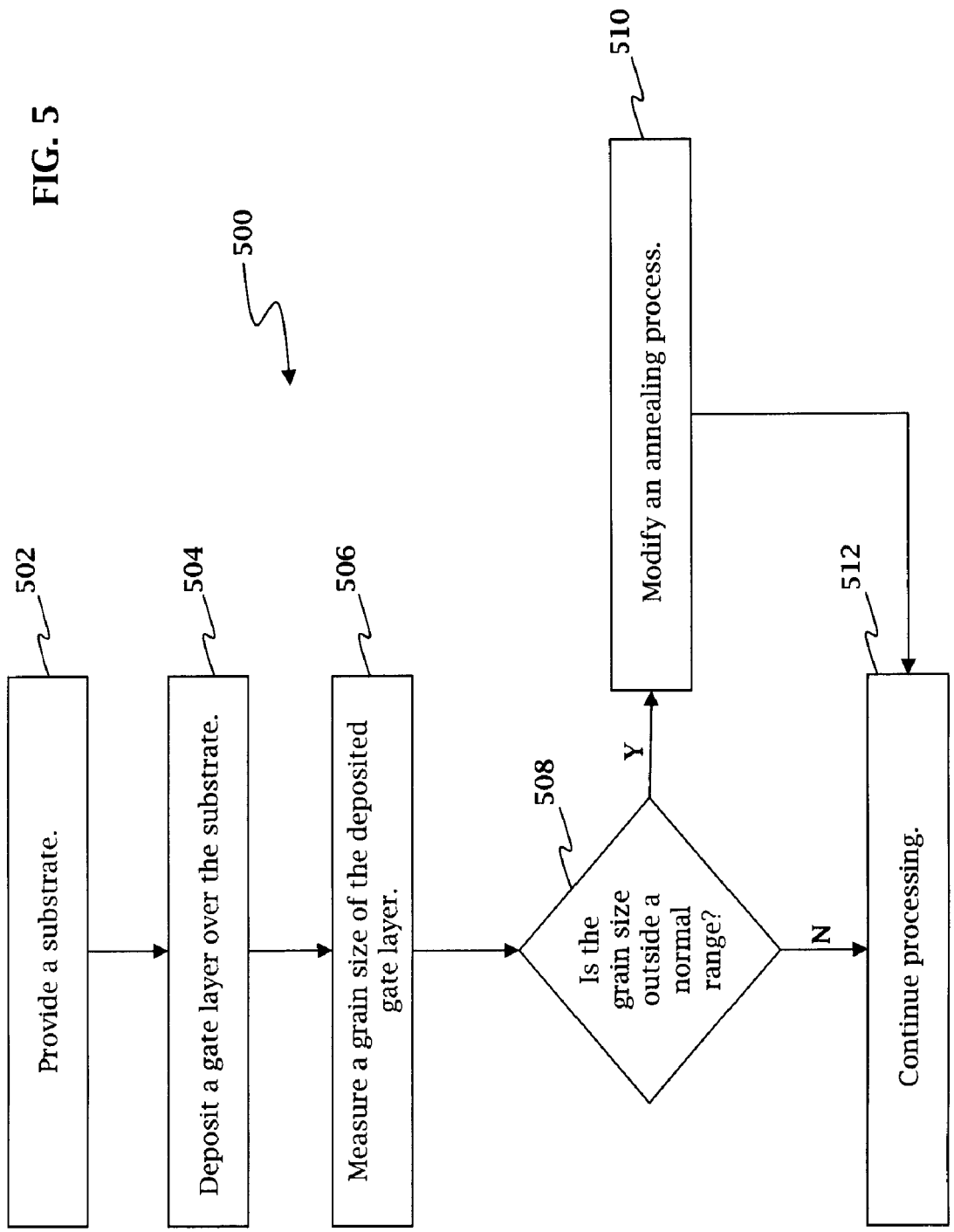
FIGS. 5-7 are flow charts of various process control methods for fabricating an integrated circuit device according to aspects of the present disclosure.
Figure 6:
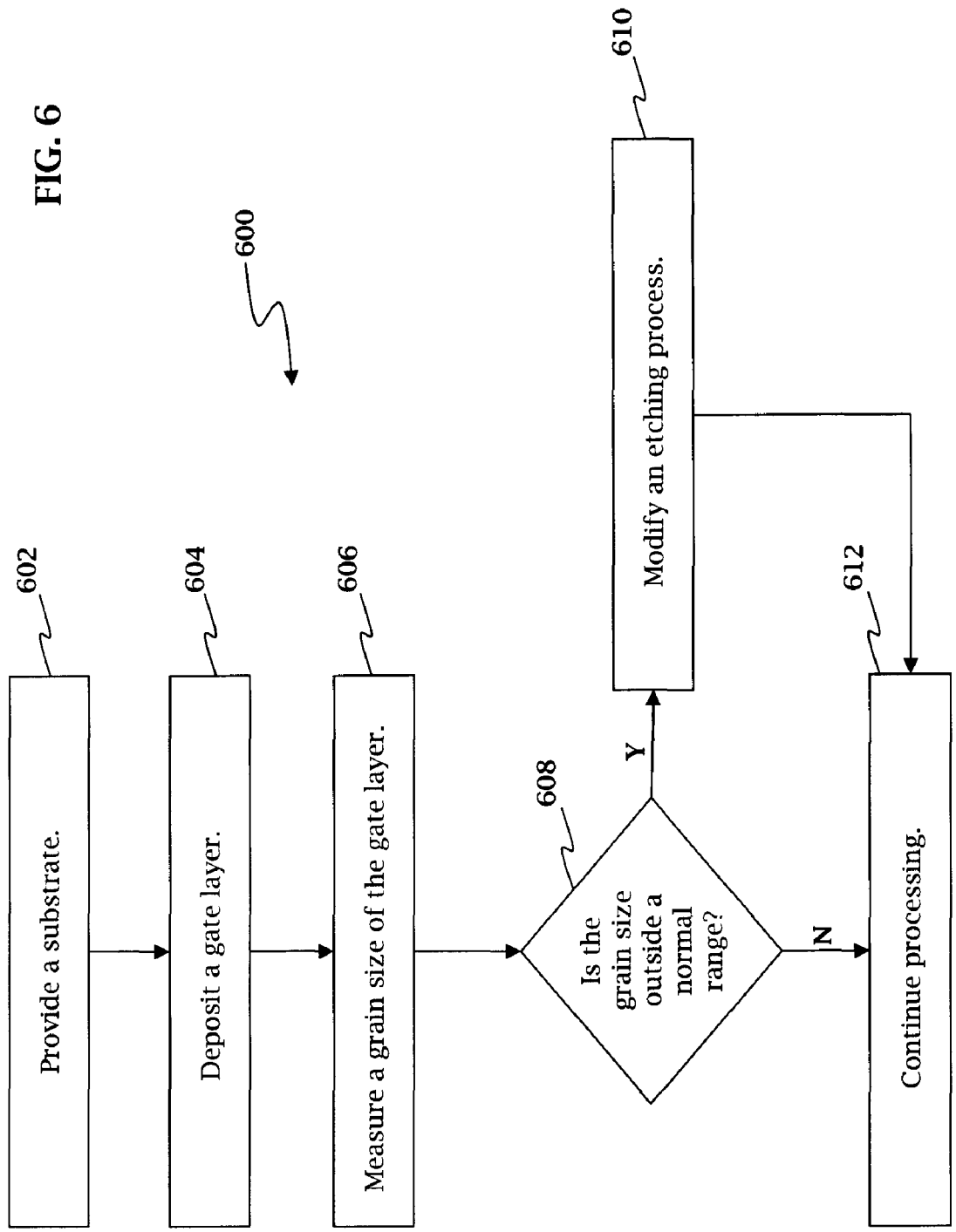
Figure 7:
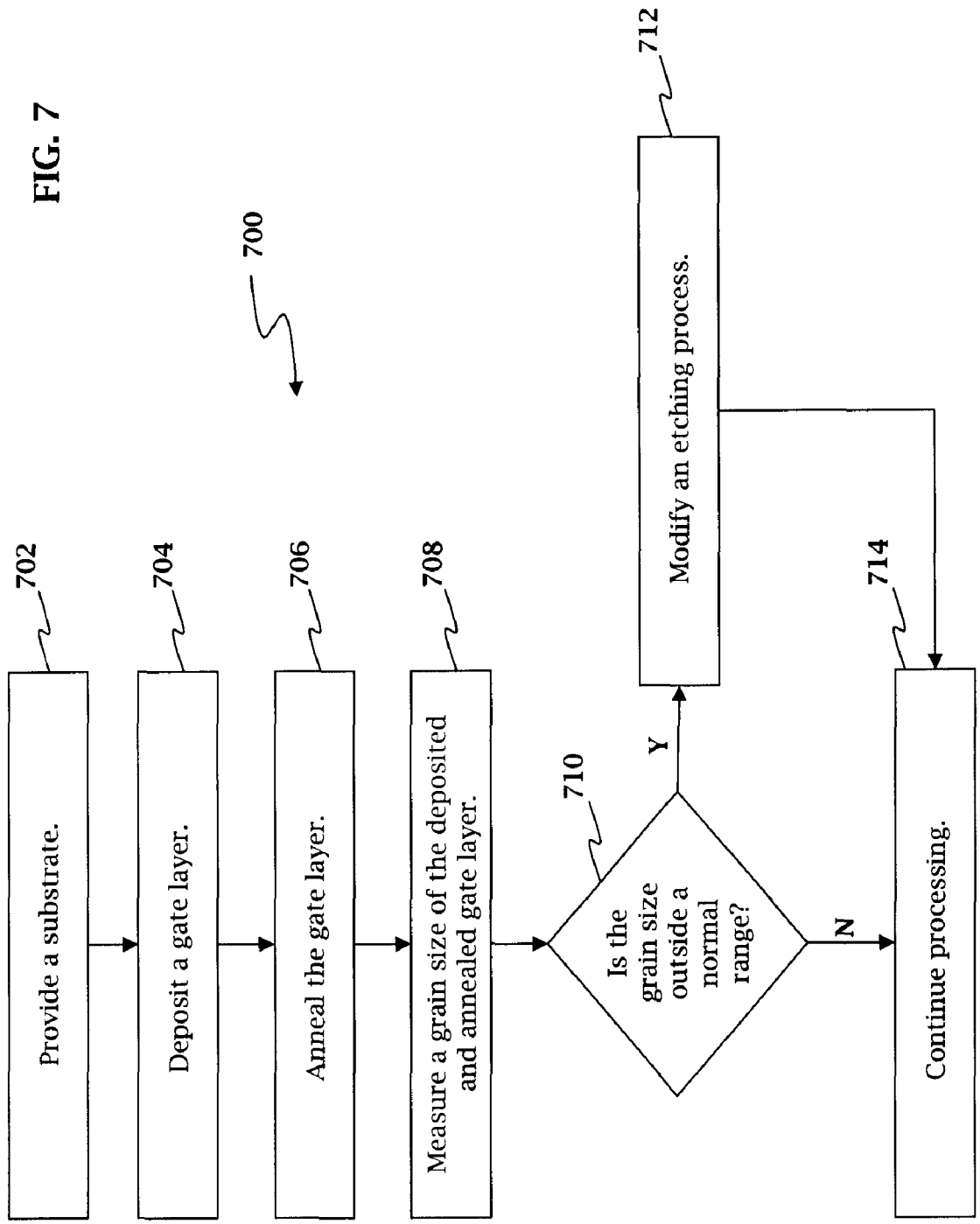

FIGS. 5-7 illustrate various flow charts providing a process control method 500, process control method 600, and process control method 700. The process control methods 500, 600, 700 provide advanced process control methods for controlling a gate profile (i.e., gate stack profile of a gate structure). The process control methods 500, 600, 700 may be implemented by the system 300 to fabricate an integrated circuit device. Particularly, an APC system, such as APC system 400, may implement the process control methods 500, 600, 700. The process control methods 500, 600, 700 will be described in light of the integrated circuit device manufacturing system 300 comprising an APC system 310 similar to APC system 400, which manages material process control flow 402. It is understood that the flowcharts in FIGS. 5-7 are but three embodiments for controlling gate profile and other methods are possible. Further, the flowcharts in FIGS. 5-7 may not be inclusive of all process steps, and the process control methods may comprise any combination of the process steps described herein or known in the art. Thus, additional steps can be provided before, during, and after the methods 500, 600, 700, and some of the steps described below can be replaced or eliminated, for additional embodiments of the methods.

Particularly, the process control methods 500, 600, 700 provide control of a deposition, annealing, and/or etching process recipe for forming one or more gate stacks having a target profile on a wafer (or substrate). The process control methods 500, 600, 700 described below may monitor and control material process control flow 402, which in the present embodiment, is similar to the method 100 illustrated in FIG. 1. Accordingly, the integrated circuit devices fabricated by the process control methods 500, 600, 700 may be similar to the semiconductor device 200 described above with reference to FIGS. 2A-2C.

Referring to FIG. 5, a deposition, annealing, and/or etching process recipe may be determined for forming one or more gate stacks having a target profile over a wafer. At step 502, a substrate is provided, and at step 504, a gate layer is deposited over the substrate. Deposition of the gate layer can occur in a processing tool 304 that implements deposition process 402A. The deposition processing tool may be in communication with the deposition process APC controller 406. The deposition process APC controller 406 may provide the deposition processing tool with the determined deposition processing recipe to form the gate layer over the substrate.

At step 506, a grain size of the deposited gate layer is measured, for example, by a post-deposition measurement process 403. The grain size measurement may be communicated to a Supervisor APC controller 404 and/or Process APC controller, such as deposition process APC controller 406. In the present embodiment, a feed-forward communication provides the grain size measurement to Supervisor APC controller 404. At step 508, it is determined whether the measured grain size is outside a normal range. The Supervisor APC controller 404 may make this determination. The normal range for the grain size may represent a target range of grain sizes, wherein when a gate layer having the target grain size is subjected to subsequent processing (i.e., an annealing and etching process to form a gate stack), the resulting gate stack exhibits the target profile.

If the measured grain size is outside the normal range, an annealing process is modified at step 510 (i.e., the determined annealing process recipe is modified). The annealing process may be modified by the Supervisor APC controller 404 notifying the annealing process APC controller 408 that the determined annealing process recipe needs to be modified. In some embodiments, the Supervisor APC controller 404 provides a desired grain size, within the normal range, so that the annealing process APC controller 408 may determine and/or select a modified annealing process recipe. Any suitable annealing process parameter may be modified to provide the modified annealing process recipe, wherein an annealed gate layer will exhibit the desired grain size. For example, the annealing process controller 408 may adjust an annealing temperature parameter in the annealing process recipe to ensure that the grain size of the gate layer returns and/or remains within the normal (or target) range. Then, processing of the substrate continues at step 512, such as the annealing process 402B and etching process 402C. Continued processing may include the gate layer being exposed to an annealing process having the modified annealing process recipe and an etching process to form a gate stack. Similarly, if the measured grain size is within the normal range, then processing of the substrate is continued at step 512. Continued processing may include the gate layer being exposed to an annealing process having the pre-determined (normal) annealing process recipe and an etching process to form the gate stack.

Referring to FIG. 6, a deposition, annealing, and/or etching process recipe may be determined for forming one or more gate stacks having a target profile over a wafer. At step 602, a substrate is provided, and at step 604, a gate layer is deposited over the substrate. This may be similar to steps 502, 504 described in FIG. 5. At step 606, a grain size of the deposited gate layer is measured, for example, by a post-deposition measurement process 403. The grain size measurement may be communicated to the Supervisor APC controller 404 and/or Process APC controller, such as deposition process APC controller 406. In the present embodiment, a feed-forward communication provides the grain size measurement to Supervisor APC controller 404. At step 608, it is determined whether the measured grain size is outside a normal range. The Supervisor APC controller 404 may make this determination. The normal range for the grain size may represent a target range of grain sizes, wherein when a gate layer having the target grain size is subjected to subsequent processing (i.e., an annealing and etching process to form a gate stack), the resulting gate stack exhibits the target profile.

If the measured grain size is outside the normal range, an etching process is modified at step 610 (i.e., the determined etching process recipe is modified). The etching process may be modified by the Supervisor APC controller 404 notifying the etching process APC controller 408 that the determined etching process recipe needs to be modified. In some embodiments, the Supervisor APC controller 404 provides a desired grain size, within the normal range, so that the etching process APC controller 408 may determine and/or select a modified etching process recipe. Any suitable etching process parameter may be modified to provide the modified etching process recipe, wherein an etched gate layer will exhibit the desired grain size and/or target gate profile. For example, the etching process APC controller 408 may adjust an etching time and/or a gas flow rate parameter in the etching process recipe to ensure that the grain size of the gate layer returns and/or remains within the normal (or target) range and/or that the resulting gate profile exhibits the target profile. Then, processing of the substrate continues at step 612. Continued processing may include the gate layer being exposed to an annealing process having the determined annealing process recipe and an etching process having the modified etching process recipe to form a gate stack. Similarly, if the measured grain size is within the normal range, then processing of the substrate is continued at step 612. Continued processing may include the gate layer being exposed to an annealing process having the determined annealing process recipe and an etching process having the determined process recipe to form the gate stack.

Referring to FIG. 7, a deposition, annealing, and/or etching process recipe may be determined for forming one or more gate stacks having a target profile over a wafer. At step 702, a substrate is provided, and at step 704, a gate layer is deposited over the substrate. Then, an annealing process is performed on the gate layer at step 706. The gate layer deposition process can occur in a processing tool 304 that implements deposition process 402A, and the gate layer annealing process can occur in a processing tool 304 that implements annealing process 402B. The deposition processing tool may be in communication with the deposition process APC controller 406, and the annealing processing tool may be in communication with the annealing process APC controller 408. The deposition, annealing process APC controllers 406, 408 communicate the determined deposition and annealing processing recipes to the deposition, annealing processing tools, respectively.

At step 708, a grain size of the deposited and annealed gate layer is measured, for example, by a post-anneal measurement process 403. The grain size measurement may be communicated to the Supervisor APC controller 404 and/or Process APC controller, such as deposition, annealing process APC controllers 406, 408. In the present embodiment, a feed-forward communication provides the grain size measurement to Supervisor APC controller 404. At step 710, it is determined whether the measured grain size is outside a normal range. The Supervisor APC controller 404 may make this determination. The normal range for the grain size may represent a target range of grain sizes, wherein when a gate layer having the target grain size is subjected to subsequent processing (i.e., an etching process to form a gate stack), the resulting gate stack exhibits the target profile.

If the measured grain size is outside the normal range, an etching process is modified at step 712 (i.e., the determined etching process recipe is modified). The etching process may be modified by the Supervisor APC controller 404 notifying the etching process APC controller 410 that the determined etching process recipe needs to be modified. In some embodiments, the Supervisor APC controller 404 provides a desired grain size, within the normal range, so that the etching process APC controller 410 may determine and/or select a modified etching process recipe. In some embodiments, the Supervisor APC controller 410 provides the target gate profile along with the post-annealing grain size, and the etching process APC controller 410 then determines and/or selects a modified etching process recipe. Any suitable etching process parameter (e.g., etching time, gas flow rate, etc.) may be modified to provide the modified etching process recipe, wherein an etched gate layer will exhibit the desired grain size and/or target gate profile. The modified etching recipe may then be communicated to the etching process 402C, and processing of the substrate continues at step 714. Continued processing may include the deposited and annealed gate layer being exposed to an etching process having the modified etching process recipe to form a gate stack. Similarly, if the measured grain size is within the normal range, then processing of the substrate is continued at step 714. Continued processing may include the gate layer being exposed to an etching process having the determined process recipe to form the gate stack.

In some embodiments, a feed-back communication provides the grain measurement to the deposition process APC controller 406. The deposition process APC controller 406 may utilize the grain measurement to determine whether various deposition parameters should be modified for deposition of material layers on subsequent wafers. In some embodiments, a feed-back communication provides the grain measurement to the annealing process APC controller 408. The annealing process APC controller 408 may utilize the grain measurement to determine whether various annealing parameters should be modified for annealing material layers on subsequent wafers. In some embodiments, a feed-back communication provides the grain measurement to the etching process APC controller 410. The etching process APC controller 410 may utilize the grain measurement to determine whether various etching parameters should be modified for etching material layers on subsequent wafers. Further, in some embodiments, the feed-back communication may be utilized to modify any one of the processes.

In summary, an advanced process control may be implemented to manage and control the profile formation of one or more gate stacks of an integrated circuit device. The disclosed methods may be easily integrated into conventional integrated circuit device processing. By utilizing feed-forward and feedback communications about characteristics of the integrated circuit devices being fabricated, processes may be modified during the fabrication process to ensure that the fabricated device exhibits target characteristics. Further, the disclosed embodiments may provide improved device performance and/or improved device uniformity. It is understood that different embodiments may have different advantages, and that no particular advantage is necessarily required of all embodiments.

Further, the present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An advanced process control (APC) method for fabricating a semiconductor device, the method comprising:
    providing a substrate;
    performing a deposition process, an annealing process, and an etching process to form a gate stack over the substrate, wherein the gate stack includes a gate layer;
    measuring a grain size of the gate layer after the deposition process and the annealing process; and
    modifying a recipe of the etching process based on one of the measured deposition grain size and the measured annealing grain size if the one of the measured deposition grain size and the measured annealing grain size of the gate layer is not within a target range, such that the gate stack has a desired profile after performing the etching process.

2. The APC method of claim 1 further comprising performing the etching process to form the gate stack based on the modified recipe.

3. The APC method of claim 1 further comprising performing a deposition process, an annealing process, and an etching process to form another gate stack over another substrate, wherein the etching process is performed based on the modified recipe.

4. The APC method of claim 1 wherein the desired gate profile is a desired sidewall angle for the gate stack, and modifying the recipe of the etching process includes modifying an etching rate of the etching process to achieve the desired sidewall angle after the etching process.

5. The APC method of claim 1 wherein modifying the etching rate of the etching process to achieve the desired sidewall angle includes increasing an etching rate of the etching process if the measured grain size is greater than the target range and decreasing an etching rate of the etching process if the measured grain size is less than the target range.

6. The APC method of claim 1 wherein the desired gate profile is a desired sidewall angle for the gate stack, and the recipe of the etching process is modified based on both the measured deposition grain size and the measured annealing size, the recipe being modified to achieve the desired sidewall angle for the gate stack after the etching process.

7. The APC method of claim 1 wherein the gate layer is a polysilicon layer.

8. The APC method of claim 1 further including modifying a recipe of the annealing process based on the measured deposition grain size if the measured deposition grain size of the gate layer is not within the target range, such that the measured annealing grain size is within the target range.

9. The APC method of claim 1 further including measuring the grain size of the gate layer after the etching process.

10. The APC method of claim 9 wherein measuring the grain size of the gate layer after the etching process comprises feeding back the measured grain size to one of the deposition process, the annealing process, the etching process, and combinations thereof.

11. The APC method of claim 8 wherein the modifying the recipe of the annealing process based on the measured deposition grain size includes increasing an annealing temperature of the annealing process if the measured grain size is less than the target range and decreasing an annealing temperature of the annealing process if the measured grain size is greater than the target range.

12. The method of claim 1 wherein measuring the grain size of the gate layer comprises performing an optical scattering method.

13. A method for controlling a gate profile during integrated circuit device fabrication, the method comprising:
    performing a deposition process to form a gate layer over a wafer;
    performing a first grain size measurement after the deposition process;
    performing an annealing process to the gate layer based on the first grain size measurement;
    performing a second grain size measurement after the annealing process; and
    performing an etching process on the gate layer based on the second grain size measurement to form a gate stack having a desired sidewall angle.

14. The method of claim 13 wherein performing the annealing process to the gate layer based on the first grain size measurement comprises:
    determining whether the first grain size measurement is within a normal range; and
    tuning a recipe for the annealing process if the first grain size is not within the normal range.

15. The method of claim 14 wherein tuning the recipe comprises adjusting an annealing temperature.

16. The method of claim 13 wherein performing the etching process on the gate layer based on the second grain size measurement comprises:
    determining whether the second grain size measurement is within a normal range; and
    tuning a recipe for the etching process if the second grain size is not within the normal range.

17. The method of claim 16 wherein tuning the recipe comprises adjusting one of an etching time, a gas flow rate, and combinations thereof.

18. The method of claim 13 further comprising tuning a recipe for the deposition process based on the first grain size measurement.

19. The method of claim 18 wherein tuning the recipe for the deposition process based on the first grain size measurement comprises:
- determining whether the first grain size measurement is within a normal range;
- modifying the recipe for the deposition process if the first grain size is not within the normal range; and
- performing the deposition process with the modified recipe to form a gate layer on another wafer.

20. A system for manufacturing an integrated circuit device, the system comprising:
- a processing tool for performing deposition process, an annealing process, and an etching process to form one or more gate stacks having a gate profile; and
- a controller in communication with the processing tool, wherein the controller controls process recipes of the deposition process, the annealing process, and the etching process to achieve a desired gate profile for the gate profile of the one or more gate stacks by:
- monitoring a measured grain size of a layer of the one or more gate stacks, the measured grain size obtained after one of the deposition process and the annealing process;
- determining whether the one of the measured deposition grain size and the measured annealing grain size is within a target range; and
- modifying a recipe of the etching process if the one of the measured deposition grain size and the measured annealing grain size of the layer is not within the target range.

* * * * *